United States Patent [19]

Matsumoto et al.

[11] Patent Number: 5,051,942
[45] Date of Patent: Sep. 24, 1991

[54] METHOD AND APPARATUS FOR CALCULATING FILTER FACTORS

[75] Inventors: Masaharu Matsumoto; Seiichi Ishikawa; Katsuaki Satoh, all of Osaka, Japan

[73] Assignee: Matsushita Electric Industrial Co., Ltd., Japan

[21] Appl. No.: 285,606

[22] Filed: Dec. 15, 1988

[30] Foreign Application Priority Data

Dec. 18, 1987 [JP] Japan .................. 62-322436

[51] Int. Cl.[5] .............................. G06F 15/31
[52] U.S. Cl. .................... 364/724.01; 364/724.16; 364/724.19
[58] Field of Search .................. 379/411; 364/724.02, 364/724.01, 724.16, 724.19, 724.2, 572, 576

[56] References Cited

U.S. PATENT DOCUMENTS

| | | | |
|---|---|---|---|
| 4,027,258 | 5/1977 | Perreault | 364/724.02 |
| 4,494,214 | 1/1985 | Bernard et al. | 364/724.19 |
| 4,524,424 | 6/1985 | White | 364/724.16 |
| 4,539,690 | 9/1985 | Speidel | 364/724.2 |
| 4,593,161 | 6/1986 | Desblache et al. | 379/411 |
| 4,742,353 | 5/1988 | D'Addio et al. | 364/724.19 |
| 4,837,723 | 6/1989 | Peacock | 364/724.01 |
| 4,843,583 | 6/1989 | White et al. | 364/724.19 |

FOREIGN PATENT DOCUMENTS 0284175 9/1988 European Pat. Off. ........ 364/724.18

Primary Examiner—Dale M. Shaw
Attorney, Agent, or Firm—Lowe, Price, LeBlanc & Becker

[57] ABSTRACT

A transfer function is determined in accordance with an amplitude characteristic and a phase characteristic. The transfer function is subjected to inverse Fourier transform. An imaginary part of a result of the inverse Fourier transform is set to zero and thereby the result of the inverse Fourier transform is converted into a converted result. The converted result is subjected to Fourier transform. The amplitude characteristic and the phase characteristic are updated in accordance with a result of the Fourier transform. Such processes are reiterated. A primary desired amplitude characteristic is corrected in accordance with the finally-obtained amplitude characteristic so that the primary desired amplitude characteristic is converted into a final desired amplitude characteristic. A final desired phase characteristic is determined in accordance with the finally-obtained phase characteristic. A second transfer function is determined in accordance with the final desired amplitude characteristic and the final desired phase characteristic. The second transfer function is subjected to inverse Fourier transform. Filter factors are calculated from a real part of a result of the inverse Fourier transform of the second transfer function. The calculated filter factors are set in a FIR digital filter.

10 Claims, 4 Drawing Sheets

METHOD AND APPARATUS FOR CALCULATING FILTER FACTORS

BACKGROUND OF THE INVENTION

This invention relates to a filter factor calculator and specifically relates to an apparatus for calculating and setting filter factors or tap coefficients of a digital filter. This invention also relates to a method of calculating and setting such filter factors.

Some digital audio systems have equalizers including a FIR (finite impulse response) digital filter. In cases where a digital audio signal is processed in real number by a single FIR filter, it is generally difficult to independently adjust an amplitude/frequency characteristic and a phase/frequency characteristic determined by the FIR filter.

SUMMARY OF THE INVENTION

It is an object of this invention to provide a method and an apparatus for calculating filter factors which enable mutually independent adjustment of an amplitude/frequency characteristic and a phase/frequency characteristic determined by a FIR filter.

In this invention, a transfer function is determined in accordance with an amplitude characteristic and a phase characteristic. The transfer function is subjected to inverse Fourier transform. An imaginary part of a result of the inverse Fourier transform is set to zero and thereby the result of the inverse Fourier transform is converted into a converted result. The converted result is subjected to Fourier transform. The amplitude characteristic and the phase characteristic are updated in accordance with a result of the Fourier transform. Such processes are reiterated. A primary desired amplitude characteristic is corrected in accordance with the finally-obtained amplitude characteristic so that the primary desired amplitude characteristic is converted into a final desired amplitude characteristic. A final desired phase characteristic is determined in accordance with the finally-obtained phase characteristic. A second transfer function is determined in accordance with the final desired amplitude characteristic and the final desired phase characteristic. The second transfer function is subjected to inverse Fourier transform. Filter factors are calculated from a real part of a result of the inverse Fourier transform of the second transfer function. The calculated filter factors are set in a FIR digital filter.

DESCRIPTION OF THE FIRST PREFERRED EMBODIMENT

Figure 1:
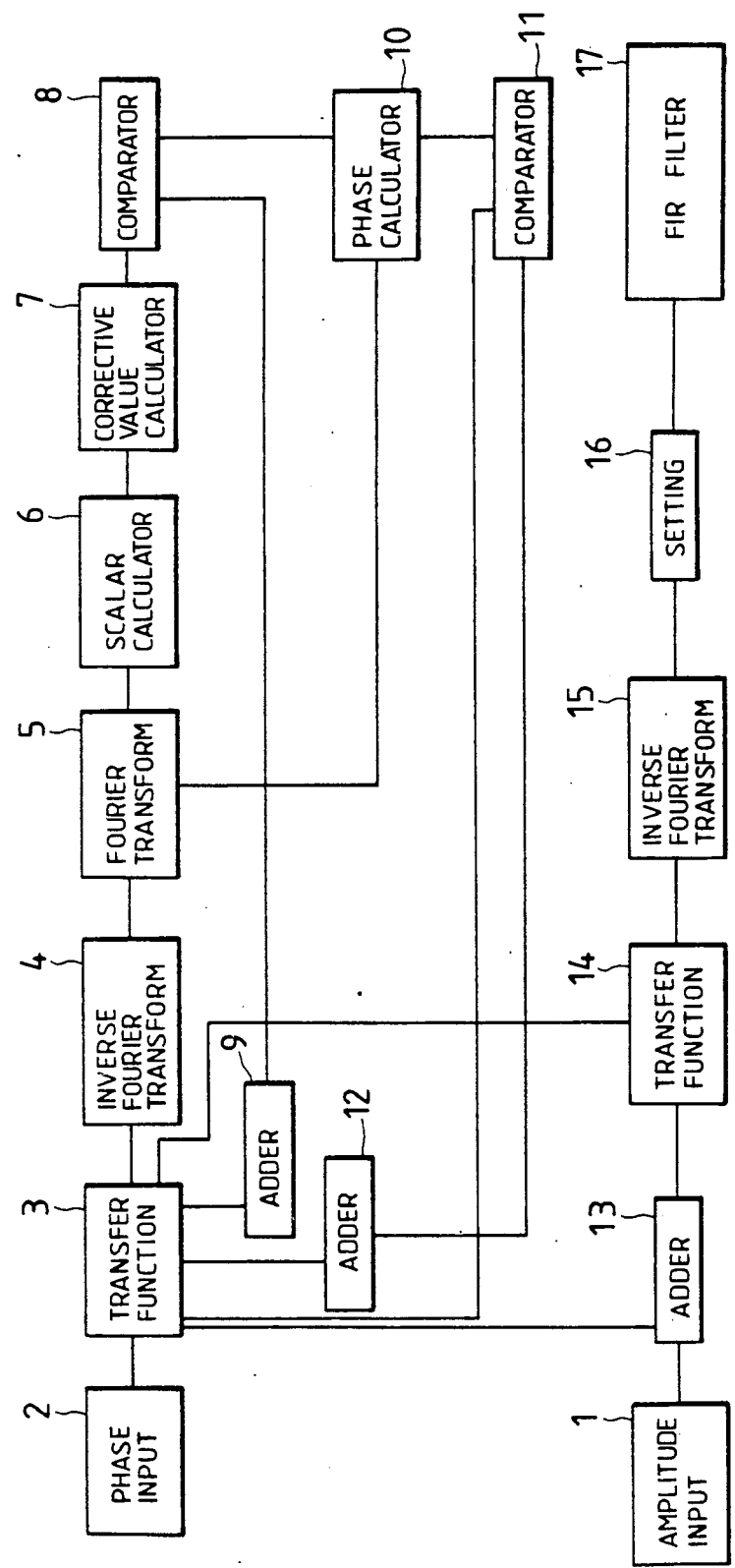
FIG. 1 is a block diagram of a FIR digital filter and a filter factor calculator according to a first embodiment of this invention.

With reference to FIG. 1, a filter factor calculator includes an amplitude input section 1 through which data representing a desired amplitude/frequency characteristic Ai are inputted. The amplitude/frequency characteristic is also referred to as the amplitude characteristic. The desired amplitude characteristic is represented by a set of amplitude values plotted at respective ones of a set of sample frequencies of the type 2. As well-known in the art, sample frequencies are of two types, that is, the type 1 and the type 2. A set of sample frequencies of the type 1 starts at a zero frequency point. A set of sample frequencies of the type 2 starts at a non-zero frequency point. Specifically, sample frequencies $\omega_k$ of the type 1 are determined by the following equations.

$$\omega_k = 2\pi \cdot k / N$$

$$k = 0 \text{ to } N-1$$

where the letter "k" denotes an integer and the letter N denotes the number of sample points. Sample frequencies $\omega_k$ of the type 2 are determined by the following equations.

$$\omega_k = 2\pi \cdot \{k + (\tfrac{1}{2})\} / N$$

$$k = 0 \text{ to } N-1$$

where the letter "k" denotes an integer and the letter N denotes the number of sample points. The desired amplitude characteristic is given in the angular frequency range of 0 to $\pi$. As will be described hereinafter, when a transfer function is determined, a desired amplitude characteristic in the angular frequency range of $\pi$ to $2\pi$ is obtained by "folding over" the desired amplitude characteristic in the range of 0 to $\pi$.

Data representing a desired group delay distortion characteristic are inputted into the filter factor calculator through a phase input section 2. For example, the desired group delay distortion characteristic is chosen so as to correspond to the distortion characteristic of a loudspeaker which reproduces an audio signal derived through the processing by a related FIR digital filter. The desired group delay distortion characteristic is represented by a set of values plotted at respective ones of sample frequencies of the type 2. The phase input section 2 includes an integrator integrating the desired group delay distortion characteristic with respect to frequency and thereby deriving a desired phase/frequency characteristic $\theta_i$. The phase/frequency characteristic is also referred to as the phase characteristic. The desired phase characteristic is given in the angular frequency range of 0 to $\pi$. As will be described hereinafter, a desired phase characteristic in the angular frequency range of $\pi$ to $2\pi$ is obtained by "folding over" the desired phase characteristic in the range of 0 to $\pi$ in a point symmetry manner.

A transfer function calculator 3 receives output data from the phase input section 2 which represent the desired phase characteristic. The transfer function calculator 3 includes a generator producing initial data representing an initial flat amplitude characteristic. The initial flat amplitude characteristic is given by amplitude values of "1" which are independent of sample frequencies. The transfer function calculator 3 computes a set of transfer functions $H_i$ by using the desired phase characteristic and the initial flat amplitude characteristic as a phase part and an amplitude part respectively.

An inverse Fourier transform section 4 receives output data from the transfer function calculator 3 which represent the transfer functions $H_i$. The inverse Fourier transform section 4 subjects the transfer functions $H_i$ to inverse Fourier transform at a set of sample frequencies of the type 1.

A Fourier transform section 5 receives output data from the inverse Fourier transform section 4 which represent results of the inverse Fourier transform performed by the inverse Fourier transform section 4. The Fourier transform section 5 forcedly sets the imaginary parts of the results of the inverse Fourier transform to zero and thereby converts the results of the inverse Fourier transform into converted results. Then, the Fourier transform section 5 performs Fourier transform of the converted results at a set of sample frequenices of the type 1.

A scalar calculator 6 receives data from the Fourier transform section 5 which represent results of the Fourier transform performed by the Fourier transform section 5. The scalar calculator 6 determines the scalar values $C_i$ of the real and imaginary parts of the results of the Fourier transform.

A corrective value calculator 7 receives output data from the scalar calculator 6 which respresent the scalar values. In respect of each of the scalar values, the corrective value calculator 7 multiplies the scalar value by the subsequent scalar value and then calculates the square root of the result of the multiplication, and finally calculates the reciprocal $B_i$ of the square root which forms a corrective value.

A comparator 8 receives output data from the corrective value calculator 7 which represent the reciprocals $B_i$. The comparator 8 checks the magnitudes of the reciprocals $B_i$.

An adder 9 receives the reciprocal data from the correction section 7 via the comparator 8. The adder 9 updates the amplitude part used in the transfer function calculator 3. Specifically, the adder 9 adds the reciprocals $B_i$ to the amplitude part and sets a new amplitude part to the resultant sum.

A phase calculator 10 receives the output data from the Fourier transform section 5 which represent the results of the Fourier transform performed by the Fourier transform section 5. In respect of each of the results of the Fourier transform, the phase calculator 10 determines the natural logarithm of the imaginary part of the result of the Fourier transform, and changes the sign of the logarithm and thereby derives the sign-changed logarithmic value. Then, the phase calculator 10 determines the average between the sign-changed logarithmic value and the subsequent sign-changed logarithmic value and uses the average as a portion of a phase characteristic. The phase calculator 10 sequentially determines the averages which together form the phase characteristic.

A comparator 11 receives output data from the phase calculator 10 which represent the phase characteristic. The comparator 11 also receives data from the transfer function calculator 3 which represent the phase characteristic set in the transfer function calculator 3. The comparator 11 calculates the difference between the two input phase characteristics. In addition, the comparator 11 determines whether or not the phase characteristic difference resides within a reference range.

An adder 12 receives output data from the comparator 11 which represent the phase characteristic difference. When the comparator 11 detects that the phase characteristic difference is outside the reference range, the adder 12 updates the phase parts used in the transfer function calculator 3. Specifically, the adder 12 adds the phase characteristic difference to the phase parts and sets new phase parts to the resultant sums. At the end of the updating process, the adder 12 produces final phase parts which are set in the transfer function calculator 3.

An adder 13 receives output data from the amplitude input section 1 which represent the desired amplitude characteristic. The adder receives output data from the transfer function calculator 3 which represents the amplitude parts used in the transfer function calculator 3. When the comparator 11 detects that the phase characteristic difference resides within the reference range, the adder 13 adds the desired amplitude characteristic and the amplitude parts to form final amplitude parts.

A transfer function calculator 14 receives output data from the adder 13 which represent the final amplitude parts. The transfer function calculator 14 also receives output data from the transfer function calculator 3 which represents the final phase parts. The transfer function calculator 14 computes transfer functions by use of the final amplitude parts and the final phase parts.

An inverse Fourier transform section 15 receives output data from the transfer function calculator 14 which represent the transfer functions. The inverse Fourier transform section 15 subjects the transfer functions to inverse Fourier transform. The real parts of results of the inverse Fourier transform performed by the inverse Fourier transform section 15 correspond to filter factors or tap coefficients.

A setting section 16 receives output data from the inverse Fourier transform section 15 which represent the filter factors. The setting section 16 sets the filter factors in a FIR filter 17.

The FIR filter 17 performs filtering of a digital signal such as a digital audio signal with the filtering characteristics determined by the filter factors fed from the setting section 16.

Figure 2:
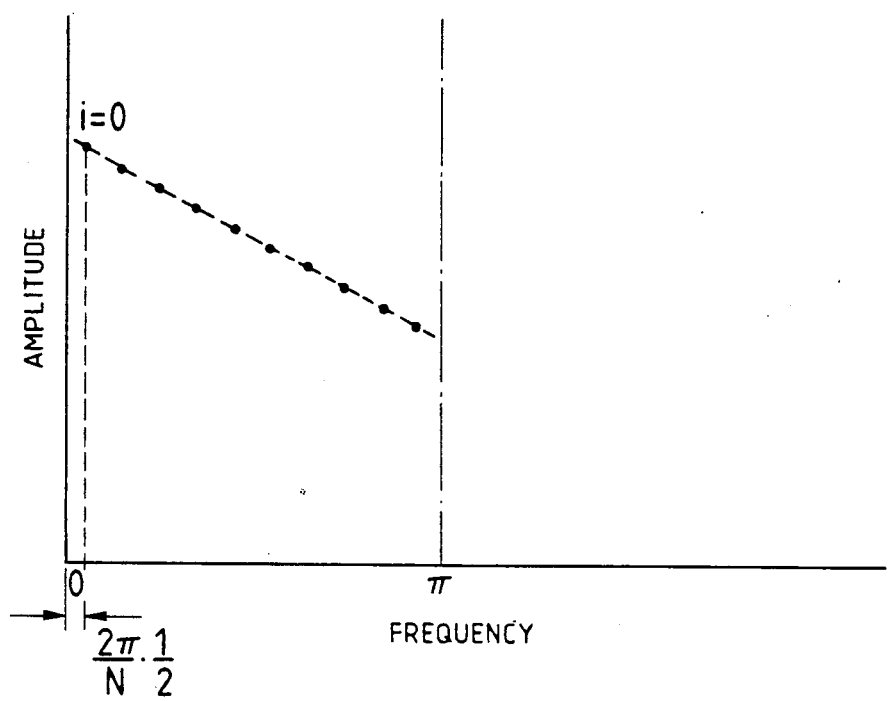
FIG. 2 is a diagram showing amplitude values plotted at sample frequencies of the type 2.

This embodiment will be described further hereinafter. In the amplitude input section 1, a desired amplitude characteristic is determined at respective ones of sample frequencies of the type 2 within the angular frequency range of 0 to $\pi$. FIG. 2 shows an example of such a desired amplitude characteristic. In FIG. 2, the black circles denote amplitude values which together form a desired amplitude characteristic. The minimum of the sample frequencies is equal to the value "$(2\pi/N)\cdot(\frac{1}{2})$" where the character N denotes the number of sample points.

In the phase input section 2, a desired group delay distortion characteristic $t_i$ is determined at respective ones of sample frequencies of the type 2 within the angular frequency range of 0 to $\pi$. The phase input section 2 integrates the desired group delay distortion characteristic $t_i$ with respect to frequency and thereby derives a desired phase characteristic $\theta_i$ by referring to the following equations.

$$\theta_0 = t_0 \cdot \pi \cdot f / 2N$$

$$\theta_i = \theta_{i-1} + (t_{i-1} + t_i) \cdot \pi \cdot f / N$$

$i = 1$ to $N-1$                  (1)

where the character "f" denotes sample frequencies and the character "i" denotes an integer, and the letter N denotes the number of sample points. In the later equations, the character "i" also denotes an integer.

The transfer function calculator 3 computes transfer functions $H_i$ in the angular frequency range of 0 to $\pi$, using initial conditions where an initial amplitude part is set to 1 and an initial phase part is set to the desired phase characteristic given from the phase input section 2. Specifically, the transfer functions $H_i$ are calculated by referring to the following equations.

Real $(H_i) = \cos \theta_i$

Imag $(H_i) = \sin \theta_i$ in the above two equations, $i = 0$ to $(N/2) - 1$

Real $(H_i) =$ Real $(H_{N-i})$

Imag $(H_i) = -$Imag $(H_{N-i})$ in the above two equations, $i = N/2$ to $N-1$   (2)

The inverse Fourier transform section 4 subject the transfer functions $H_i$ to inverse Fourier transform at a set of sample frequencies of the type 1. Specifically, results h(n) of the inverse Fourier transform are given by the following equations.

$$h(n) = 1/N \cdot \sum_{k=0}^{N-1} H(\omega) \cdot e^{j\omega n} \quad (2A)$$

$$\omega = 2\pi k/N, \ 0 \leq n \leq N - 1$$

where the character "n" denotes an integer and the character $H(\omega)$ corresponds to the transfer functions $H_i$. In the later equations, the character "n" denotes an integer.

If the phase parts determined by the equations (2) agreed with an odd function, the results of the inverse Fourier transform would contain only real numbers. Accordingly, in this assumptive case, if the results of the inverse Fourier transform were directly set in the FIR filter 17 as filter factors, the desired amplitude characteristic and the desired phase characteristic could be realized. Actually, the phase characteristic determined by the equations (2) disagrees with an odd function and thus the phase characteristic is discontinuous at an angular frequency of $\pi$ since an arbitrary group delay distortion characteristic is set via the phase input section 2. Accordingly, the results of the inverse Fourier transform contain imaginary parts in addition to real parts. If the real parts of such results were set in the FIR filter 17 as filter factors, their imaginary parts would cause a realized amplitude characteristic and a realized phase characteristic to deviate from the desired amplitude characteristic and the desired phase characteristic respectively. In view of this matter, the following correction is performed.

During the correction, the Fourier transform section 5 forcedly sets the imaginary parts of the results of the inverse Fourier transform to zero and thereby converts the results of the inverse Fourier transform into converted results. The Fourier transform section 5 performs Fourier transform of the converted results at a set of sample frequenices of the type 1. The scalar calculator 6 determines scalars or amplitude values $C_i$ of the real parts $R_i$ and the imaginary parts $I_i$ of results of the Fourier transform by referring to the following equation.

$$C_i = (R_i^2 + I_i^2)^{\frac{1}{2}} \quad (3)$$

In the case where the desired amplitude characteristic set via the amplitude input section 1 is flat, the scalars $C_i$ correspond to the amplitude characteristic which is obtained when the real parts of the results of the inverse Fourier transform are directly set in the FIR filter 17. The amplitude values used in the transfer function calculator 3 are preferably corrected so that the scalars $C_i$ can agree with the amplitude values set via the amplitude input section 1. The following fact was experimentally found. In the case where the set phase characteristic remained constant or equal, the difference between the set amplitude characteristic and the actual amplitude characteristic, which was obtained when the real parts of the results of the inverse Fourier transform were directly set in the FIR filter 17, was independent of whether or not the set amplitude characteristic was flat (equals 1). Accordingly, the corrective values are determined on the basis of the flat amplitude characteristic which equals 1, and the finally-obtained characteristic is used to determine the filter factors. It should be noted that the convergence toward proper values sometimes fails to occur when the correction is performed under conditions where the set amplitude characteristic is used as a target amplitude characteristic.

The desired amplitude characteristic and the desired group delay distortion characteristic are set with respect to sample frequencies of the type 2, while the inverse Fourier transform and the Fourier transform are performed with respect to sample frequencies of the type 1. The differentiated sample frequency types produces an effect similar to a window effect, thereby preventing ripples from occurring in the realized amplitude characteristic. In cases where two different types of sample frequencies are used as in this embodiment, frequency points would be offset and accurate correction could not be performed if the scalar $C_i$ were directly used. Accordingly, the corrective value calculator 7 calculates the corrective values $B_i$ which are designed so as to compensate the frequency offset. Specifically, the corrective values $B_i$ are determined by referring to the following equations.

$$B_i = 1/(C_i \cdot C_{i+1})^{\frac{1}{2}}$$

$i = 0$ to $N-1$                  (4)

The logarithm of the upper equation (4) results in the following equation.

$$b_i = 0 - \{(c_i + c_{i+1})/2\} \quad (5)$$

As understood from the equation (5), a corrective value $b_i$ equals zero minus the average between an amplitude value $c_i$ and a subsequent amplitude value $c_{i+1}$.

Figure 3:
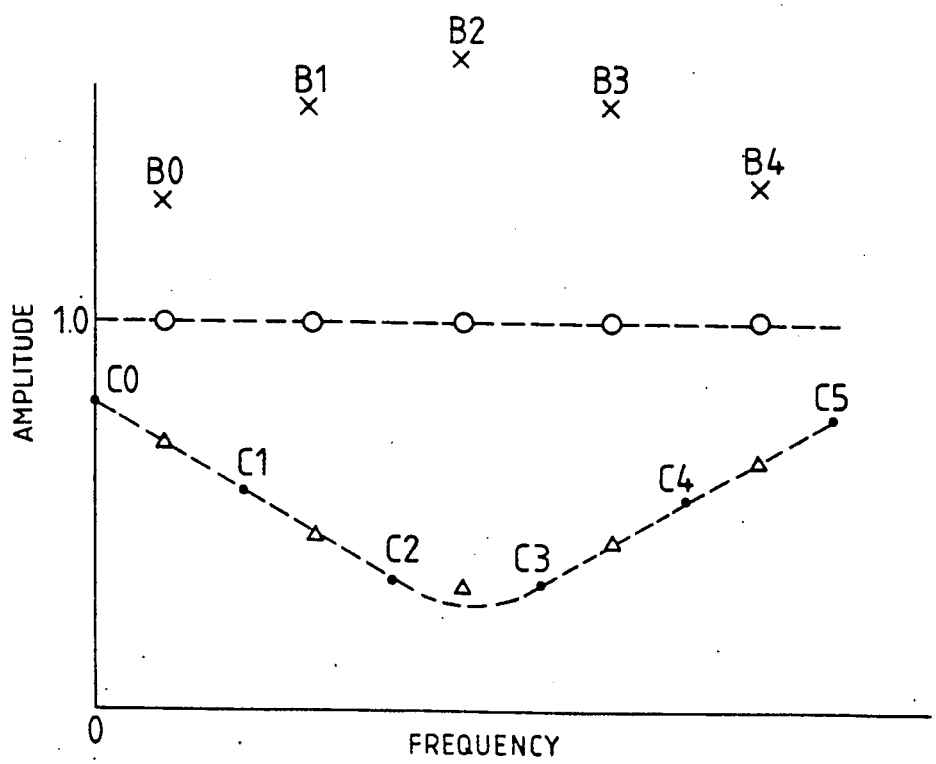
FIG. 3 is a diagram showing the relationship among the desired amplitude values, the scalar values, and the amplitude corrective values used or generated in the filter factor calculator of FIG. 1.

FIG. 3 shows the relationship between the scalars $C_i$ and the corrective values $B_i$. In FIG. 3: the white circles denote desired amplitude values equal to 1; the dots (small black circles) denote the scalars $C_i$; and the marks "X" denote the corrective values $B_i$.

The comparator 8 determines whether or not the corrective values $B_i$ are within a predetermined reference range. When the corrective values $B_i$ are outside the reference range, the adder 9 updates the amplitude characteristic set in the transfer function calculator 3. Specifically, the corrective values $B_i$ are added to the amplitude characteristic currently set in the transfer function calculator 3, and the resultant is set in the transfer function calculator 3 as a new amplitude characteristic. During the first execution cycle of the series of the calculations performed by the devices 3-9, the amplitude characteristic equal to 1 is set in the transfer function calculator 3 so that a new amplitude characteristic will be formed purely by the corrective values $B_i$. During the second and later execution cycles of the calculation series, new corrective values $B_i$ are added to the previous corrective values $B_i$ in the updating of the amplitude characteristic. The calculation series is periodically reiterated until the comparator 8 detects that the corrective values $B_i$ move into the reference range. It should be noted that the calculation series may be reiterated a predetermined number of times independent of whether or not the corrective values $B_i$ move into the reference range.

When the corrective values $B_i$ move into the reference range, the correction of the phase characteristic is started. In cases where the values which are determined by the Fourier transform in the Fourier transform section 5 correspond to real parts $R_i$ and imaginary parts $I_i$, the related transfer functions $H'_i$ are given by the following equations.

$$H'_i = R_i + jI_i$$

$$i = 0 \text{ to } N-1 \tag{6}$$

The amplitude values $A'_i$ and the phases $\theta'_i$ are given in the following equation.

$$H'_i = A'_i \exp(-j\theta'_i) \tag{7}$$

The natural logarithm of the equation (7) results in the following equation.

$$\ln H'_i = \ln A'_i - j\theta'_i \tag{8}$$

The natural logarithm of the equation (6) results in the following equation.

$$\ln H'_i = \ln R_i + j \ln I_i \tag{9}$$

When the equations (8) and (9) are compared, the following equation is obtained.

$$\theta'_i = -\ln I_i \tag{10}$$

To compensate the frequency offset, the phases $\theta'_i$ are corrected by the following equations.

$$\theta'_i = (\theta'_i + \theta'_{i+1})/2$$

$$i = 0 \text{ to } N-1 \tag{11}$$

In accordance with the equation (10), the phase calculator 10 determines the natural logarithms of the imaginary parts of the results of the Fourier transform in the Fourier transform section 5 and then changes the signs of the natural logarithms to obtain the phases $\theta'_i$. In accordance with the upper equation (11), the phase calculator 10 determines the averages between the phases $\theta'_i$ and the subsequent phases $\theta'_{i+1}$ and uses these averages as the corrected phases $\theta'_i$ forming the phase characteristic.

The comparator 11 calculates the difference between the phase characteristic determined by the phase calculator 10 and the phase characteristic currently set in the transfer function calculator 3, and determines whether or not this difference resides within a predetermined reference range. When the phase characteristic difference is outside the reference range, the adder 12 updates the phase characteristic set in the transfer function calculator 3. Specifically, the phase characteristic difference is added to the phase characteristic currently set in the transfer function calculator 3, and the resultant is set in the transfer function calculator 3 as a new phase characteristic. These processes are periodically reiterated until the comparator 11 detects that the phase characteristic difference moves into the reference range. It should be noted that the processes may be reiterated a predetermined number of times independent of whether or not the phase characteristic difference moves into the reference range.

When the phase characteristic difference moves into the reference range, the adder 13 adds the amplitude corrective values (or the amplitude characteristic finally set in the transfer function calculator 3) to the amplitude characteristic set via the amplitude input section 1 and sets the resultant sum to the transfer function calculator 14 as an amplitude part. In addition, the phase characteristic set in the transfer function calculator 3 is transferred to the tranferred function calculator 14 and is used as a phase part in the transfer function calculator 14. The transfer function calculator 14 computes the transfer functions in accordance with the received amplitude and phase characteristics. The inverse Fourier transform section 15 subjects the computed transfer functions to inverse Fourier transform. The setting section 16 sets the real parts of the results of the inverse Fourier transform into the FIR filter 17 as filter factors. Since the correction of the amplitude and phase characteristics is performed as described previously, filter factors accurately corresponding to the desired amplitude and phase characteristics can be set in the FIR filter 17.

It should be noted that this embodiment may be modified in various ways. In a first modification, the desired phase characteristic is directly inputted via the phase input section 2. In a second modification, the desired amplitude characteristic and the desired group delay distortion characteristic are set via the input sections 1 and 2 at sample frequencies of the type 1, while the Fourier transform and the inverse Fourier transform are performed with respect to sample frequencies of the type 2. In a third modification, the correction of the phase characteristic precedes the correction of the amplitude characteristic.

DESCRIPTION OF THE SECOND PREFERRED EMBODIMENT

Figure 4:
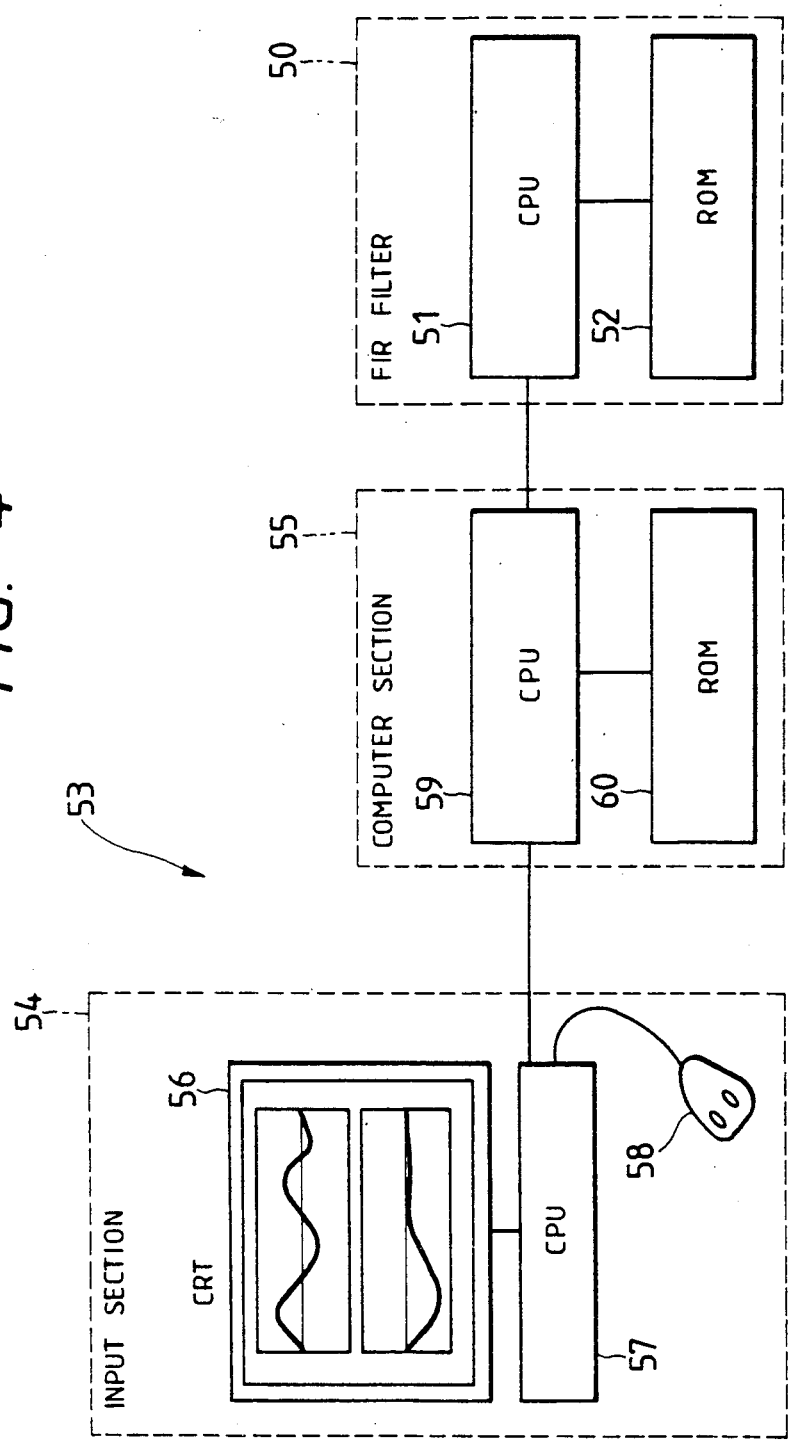
FIG. 4 is a block diagram of a FIR digital filter and a filter factor calculator according to a second embodiment of this invention.

With reference to FIG. 4, a FIR filter 50 is composed of a combination of a central processing unit (CPU) 51 and a read only memory (ROM) 52. A digital audio signal is inputted into the FIR filter 50 via a suitable input device (not shown). The CPU 51 executes a filtering process of the input digital audio signal in accordance with a program stored in the ROM 52. The CPU 51 includes registers storing filter factors which are transferred from a filter factor calculator 53. The filter factors are used in the filtering process executed by the CPU 51 so that the filter factors determine the characteristics of the filtering process. The filtering process converts the input digital audio signal into a filtered digital audio signal which is outputted from the FIR filter 50 via a suitable output device (not shown).

The filter factor calculator 53 includes a combination of an input section 54 and a computer section 55. The input section 54 has a combination of a cathode-ray tube (CRT) display 56, a CPU unit 57, and a manual device 58 such as a mouse. The CPU unit 57 is programmed to enable the following operations. Curves corresponding to a desired amplitude characteristic and a desired group delay distortion characteristic are indicated on the CRT display 56 by operating the manual device 58. The indicated curves are changed freely by controlling the manual device 58 so that the desired amplitude characteristic and the desired group delay distortion characteristic are adjustable. The CPU unit 57 includes registers holding data corresponding to the indicated curves, that is, corresponding to the desired amplitude characteristic and the desired group delay distortion characteristic. The desired amplitude characteristic and the desired group delay distortion characteristic are represented by data values plotted at sample frequencies of the type 2. When a data transfer instruction is inputted by actuating a switch of the manual device 58, the data representing the desired amplitude characteristic and the desired group delay distortion characteristic are transferred from the CPU unit 57 to the computer section 55.

Figure 5:
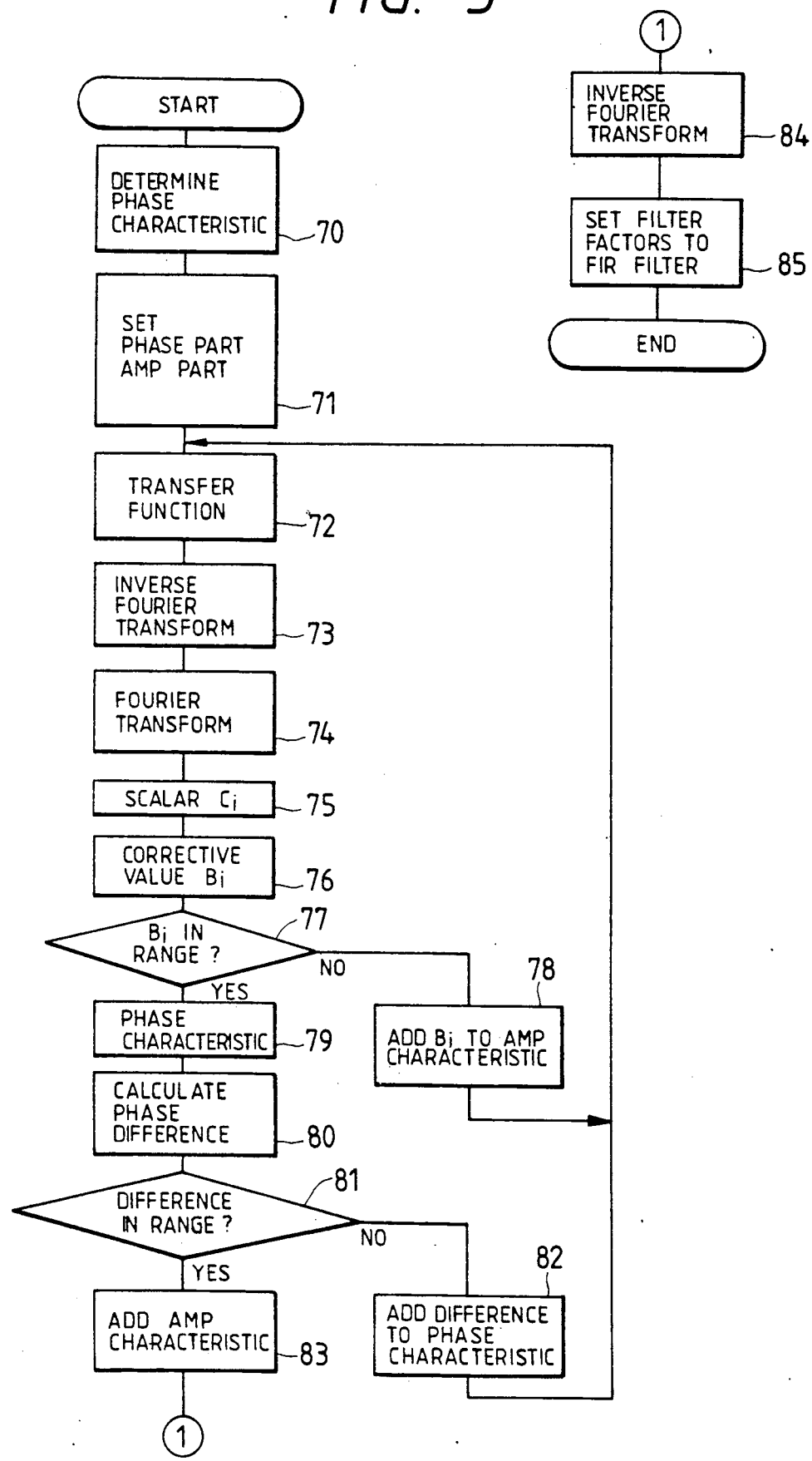
FIG. 5 is a flowchart of a program operating the filter factor calculator of FIG. 4.

The computer section 55 is preferably composed of a digital signal processor (DSP). The computer section 55 includes a combination of a CPU 59 and a ROM 60. The CPU 59 has registers holding the data of the desired amplitude characteristic and the desired group delay distortion characteristic which are transferred from the input section 54. The CPU 59 also has registers holding calculated filter factors which are transferred to the FIR filter 50. The CPU 59 operates in accordance with a program stored in the ROM 60. FIG. 5 is a flowchart of this program.

As shown in FIG. 5, a first block 70 of the program integrated the desired group delay distortion characteristic with respect to frequency to obtain a primary desired phase characteristic. Specifically, the integral process is performed by referring to the equations (1).

A block 71 following the block 70 sets amplitude parts to 1 and sets phase parts to the primary desired phase characteristic. After the block 71, the program advances to a block 72.

The block 72 computes transfer functions in accordance with the set amplitude parts and the set phase parts. Specifically, the transfer functions are determined by referring to the equations (2).

A block 73 following the block 72 performs inverse Fourier transform of the transfer functions at sample frequencies of the type 1 by referring to the equation (2A).

A block 74 following the block 73 sets the imaginary parts of results of the inverse Fourier transform to 0 and thereby changes the results of the inverse Fourier transform into converted results. The block 74 performs Fourier transform of the converted results at sample frequencies of the first type.

A block 75 following the block 73 calculates the scalars $C_i$ from the real parts and the imaginary parts of results of the Fourier transform by referring to the equation (3).

A block 76 following the block 75 calculates the amplitude corrective values $B_i$ from the scalars $C_i$ and the subsequent scalars $C_{i+1}$ by referring to the equation (4).

A block 77 following the block 76 determines whether or not the amplitude corrective values $B_i$ reside within a predetermined reference range. When the amplitude corrective values $B_i$ do not reside within the reference range, the program advances to a block 78. When the amplitude corrective values $B_i$ reside within the reference range, the program advances to a block 79.

The block 78 updates the amplitude parts used in the block 72. Specifically, the block 78 adds the amplitude corrective values $B_i$ to the current amplitude parts and sets new amplitude parts to the resultant sums. After the block 78, the program returns to the block 72.

The series of the blocks 72–78 is periodically reiterated until the amplitude corrective values $B_i$ move into the reference range. It should be noted that the series of the blocks 72–78 may be reiterated a predetermined number of times independent of whether or not the corrective amplitude values $B_i$ moves into the reference range.

The block 79 calculates the phase corrective values from the imaginary parts of the results of the Fourier transform performed by the block 74. Specifically, the block 79 calculates the natural logarithms of the imaginary parts of the results of the Fourier transform and then changes the signs of the natural logarithms in accordance with the equation (10) to obtain the first phase corrective values. The block 79 calculates the averages between the first phase corrective values and the subsequent first phase corrective values in accordance with the equation (11) to obtain the second corrective values.

A block 80 following the block 79 calculates the differences between the second phase corrective values and the phase parts used in the block 72.

A block 81 following the block 80 determines whether or not the phase differences reside within a predetermined reference range. When the phase differences do not reside within the reference range, the program advances to a block 82. When the phase differences reside within the reference range, the program advances to a block 83.

The block 82 updates the phase parts used in the block 72. Specifically, the block 82 adds the second phase corrective values to the current phase parts and sets new phase parts to the resultant sums. After the block 82, the program returns to the block 72.

The series of the blocks 72–82 is periodically reiterated until the phase differences move into the reference range. It should be noted that the series of the blocks 72–82 may be reiterated a predetermined number of times independent of whether or not the phase differences move into the reference range.

The block 83 adds the amplitude corrective values to the desired amplitude characteristic to obtain final amplitude parts. In addition, the block 83 sets final phase parts to the phase parts used in the block 72.

A block 84 following the block 83 determines transfer functions in accordance with the final amplitude parts and the final phase parts. The block 84 performs inverse Fourier transform of the determined transfer functions at sample frequencies of the first type I.

A block 85 following the block 84 determines filter factors which are equal to the real parts of results of the inverse Fourier transform performed by the block 84.

The block 85 transfers the determined filter factors to the FIR filter 50. After the block 85, the program ends.

What is claimed is:

1. A filter factor calculator for a FIR digital filter receiving an audio signal from an audio signal producing device, comprising:

first transfer function means for calculating a first transfer function from an amplitude characteristic and a phase characteristic set therein;

means for setting a desired phase characteristic in the first transfer function means;

first inverse Fourier transform means for performing first inverse Fourier transform of the first transfer function;

means for forcedly setting an imaginary part of a result of the first inverse Fourier transform to zero and thereby converting the result of the first inverse Fourier transform into a first converted result;

first Fourier transform means for converting Fourier transform of the first converted result;

means for calculating an amplitude value from a result of the Fourier transform;

means for calculating an amplitude corrective value from the calculated amplitude value;

means for comparing the amplitude corrective value with a first reference;

means for, when the amplitude corrective value is greater than the first reference, adding the amplitude corrective value to an amplitude value of the amplitude characteristic set in the first transfer function means and thereby deriving a corrective amplitude characteristic;

means for setting the corrective amplitude characteristic in the first transfer function means in place of the previously set amplitude characteristic;

means for calculating a phase characteristic from the result of the Fourier transform;

means for calculating a difference between the calculated phase characteristic and the phase characteristic set in the first transfer function means;

means for comparing the phase difference with a second reference;

means for, when the phase difference is greater than the second reference, adding the phase difference to the phase characteristic set in the first transfer function means and thereby deriving a corrective phase characteristic;

means for setting the corrective phase characteristic in the first transfer function means in place of the previously set phase characteristic;

means for setting a primary desired amplitude characteristic;

means for correcting the primary desired amplitude characteristic in accordance with the corrective amplitude characteristic and thereby deriving a final desired amplitude characteristic;

second transfer function means for calculating a second transfer function from the final desired amplitude characteristic and the corrective phase characteristic;

second inverse Fourier transform means for performing second inverse Fourier transform of the second transfer function;

means for calculating filter factors from a real part of result of the second inverse Fourier transform; and means for setting the calculated filter factors in the FIR filter;

said FIR filter changing characteristics of said received audio signal in accordance with said calculated filter factors.

2. The calculator of claim 1 wherein the amplitude characteristic setting means and the phase characteristic setting means set the related amplitude characteristic and the related phase characteristic at a set of sample frequencies of a second type which starts at a non-zero frequency point, the first and second inverse Fourier transform means and the first Fourier transform means perform the related conversions at a set of sample frequencies of a first group which starts at a zero frequency point.

3. The calculator of claim 1 wherein the amplitude characteristic setting means and the phase characteristic setting means set the related amplitude characteristic and the related phase characteristic at a set of sample frequencies of a first type which starts at a zero frequency point, the first and second inverse Fourier transform means and the first Fourier transform means perform the related conversions at a set of sample frequencies of a second group which starts at a non-zero frequency point.

4. The calculator of claim 1 wherein the phase setting means comprises means for setting a group delay distortion characteristic, and an integrator for integrating the group delay distortion characteristic with respect to frequency and thereby deriving the desired phase characteristic.

5. The calculator of claim 1 further including a FIR digital filter for changing said amplitude and phase characteristics of an input signal in accordance with said filter factors set therein.

6. The calculator of claim 1 wherein said means for setting comprises means for changing tap coefficients of the FIR filter.

7. A filter factor calculator for a FIR digital filter receiving an audio signal from an audio signal producing device, comprising:

means for setting a first phase/frequency characteristic;

means for setting a first amplitude/frequency characteristic;

means for determining a first transfer function in accordance with the first phase/frequency characteristic and the first amplitude/frequency characteristic;

means for performing a first inverse Fourier transform of the first transfer function;

means for forcedly setting an imaginary part of a result of the first inverse Fourier transform to zero and thereby converting the result of the first inverse Fourier transform into a first converted result;

means for performing a Fourier transform of the first converted result;

means for deriving a first corrective amplitude/frequency characteristic from a result of the Fourier transform;

means for correcting the first amplitude/frequency characteristic in accordance with the first corrective amplitude/frequency characteristic and thereby deriving a second amplitude/frequency characteristic;

means for determining a first corrective phase/frequency characteristic in accordance with the result of the Fourier transform;

means for correcting the first phase/frequency characteristic in accordance with the first corrective phase/frequency characteristic and thereby deriving a second phase/frequency characteristic;

means for determining a second transfer function in accordance with the second phase/frequency characteristic and the second amplitude/frequency characteristic;

means for performing a second inverse Fourier transform of the second transfer function;

means for forcedly setting an imaginary part of a result of the second inverse Fourier transform to zero and thereby converting the result of the second inverse Fourier transform into a second converted result;

means for performing a second Fourier transform of the second converted result;

means for determining a second corrective amplitude/frequency characteristic in accordance with a result of the second Fourier transform;

means for setting an adjustable primary desired amplitude/frequency characteristic;

means for correcting the primary desired amplitude/frequency characteristic on the basis of the second corrective amplitude/frequency characteristic and thereby deriving a final desired amplitude/frequency characteristic;

means for determining a second corrective phase/frequency characteristic in accordance with the result of the second Fourier transform;

means for determining a final desired phase/frequency characteristic on the basis of the second phase/frequency characteristic;

means for determining a third transfer function in accordance with the final desired amplitude/frequency characteristic and the final desired phase/frequency characteristic;

means for performing a third inverse Fourier transform of the third transfer function; and means for determining filter factors in accordance with a real part of a result of the third inverse Fourier transform; and means for setting the determined filter factors in the FIR digital filter;

said FIR filter changing characteristics of said received audio signal in accordance with said calculated filter factors.

8. The calculator of claim 7 further including a FIR digital filter for changing said amplitude and phase characteristics of an input signal in accordance with said filter factors set therein.

9. The calculator of claim 7 wherein said means for setting comprises means for changing tap coefficients of the FIR filter.

10. A method of calculating filter factors for a FIR filter receiving an audio signal having amplitude and phase characteristics, comprising the steps of:
(a) determining a transfer function in accordance with an amplitude/frequency characteristic and a phase/frequency characteristic;
(b) performing an inverse Fourier transform of the transfer function;
(c) setting an imaginary part of a result of the inverse Fourier transform to zero and thereby converting the result of the inverse Fourier transform into a converted result;
(d) performing a Fourier transform of the converted result;
(e) updating the amplitude/frequency characteristic and the phase/frequency characteristic in accordance with a result of the Fourier transform;
(f) repeating the steps (a)–(e);
(g) correcting a primary desired amplitude/frequency characteristic in accordance with the finally-updated amplitude/frequency characteristic and thereby converting the primary desired amplitude/frequency characteristic into a final desired amplitude/frequency characteristic;
(h) determining a final desired phase/frequency characteristic in accordance with the finally-updated phase/frequency characteristic;
(i) determining a second transfer function in accordance with the final desired amplitude/frequency characteristic and the final desired phase/frequency characteristic;
(j) performing an inverse Fourier transform of the second transfer function;
(k) calculating filter factors from a real part of a result of the inverse Fourier transform of the second transfer function;
(l) setting the calculated filter factors in said FIR digital filter; and
(m) using said FIR filter for changing characteristics of said received audio signal in accordance with said calculated filter factors.

* * * * *